(12) United States Patent
Koo et al.

(10) Patent No.: US 8,378,421 B2
(45) Date of Patent: Feb. 19, 2013

(54) METHOD OF MANUFACTURING THIN FILM TRANSISTOR AND THIN FILM TRANSISTOR SUBSTRATE

(75) Inventors: Jae Bon Koo, Daejeon (KR); In-Kyu You, Daejeon (KR); Seongdeok Ahn, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/350,037

(22) Filed: Jan. 13, 2012

(65) Prior Publication Data

US 2012/0161234 A1    Jun. 28, 2012

Related U.S. Application Data

(62) Division of application No. 12/507,725, filed on Jul. 22, 2009, now Pat. No. 8,119,463.

(30) Foreign Application Priority Data

Dec. 5, 2008    (KR) .................. 10-2008-0123240
Mar. 27, 2009    (KR) .................. 10-2009-0026256

(51) Int. Cl.
*H01L 27/12*    (2006.01)

(52) U.S. Cl. ............... 257/347; 257/286; 257/E29.242; 438/149; 438/151; 438/154

(58) Field of Classification Search .................. 438/149, 438/151, 154; 257/286, 347, E29.422
See application file for complete search history.

(56) References Cited

U.S. PATENT DOCUMENTS

| | | | |
|---|---|---|---|
| 5,010,027 A | 4/1991 | Possin et al. | |
| 5,111,260 A | 5/1992 | Malhi et al. | |
| 5,338,959 A | 8/1994 | Kim et al. | |
| 5,488,005 A * | 1/1996 | Han et al. | 438/163 |
| 5,693,959 A * | 12/1997 | Inoue et al. | 257/66 |
| 5,989,944 A | 11/1999 | Yoon | |
| 6,380,558 B1 | 4/2002 | Yamazaki et al. | |
| 7,354,809 B2 | 4/2008 | Yuan et al. | |
| 7,663,310 B2 * | 2/2010 | Lee et al. | 313/509 |
| 7,851,787 B2 * | 12/2010 | Han | 257/40 |
| 2009/0199960 A1 | 8/2009 | Nuzzo et al. | |

FOREIGN PATENT DOCUMENTS

| | | |
|---|---|---|
| JP | 2003-323132 A | 11/2003 |
| KR | 10-0817215 | 3/2008 |
| KR | 10-0832873 | 5/2008 |

OTHER PUBLICATIONS

Tadashi Arai et al., "Self-Aligned Fabrication Process of Electrode for Organic Thin-Film Transistors on Flexible Substrate Using Photosensitive Self-Assembled Monolayers" Japanese Journal of Applied Physics, vol. 46, No. 4B, 2007, pp. 2700-2703.
Masahiko Ando et al., "Self-aligned self-assembly process for fabricating organic thin-film transistors" Applied Physics Letters, vol. 85, No. 10, Sep. 6, 2004, pp. 1849-1851.
Jong-Hyun Ahn et al., "High-Speed Mechanically Flexible Single-Crystal Silicon Thin-Film Transistors on Plastic Substrates" IEEE Electron Device Letters, vol. 27, No. 6, Jun. 2006, pp. 460-462.
Matthew A. Meitl et al., "Transfer printing by kinetic control of adhesion to an elastomeric stamp" Nature Materials, vol. 5, Jan. 2006, pp. 33-38.

\* cited by examiner

*Primary Examiner* — Leonard Chang
(74) *Attorney, Agent, or Firm* — Rabin & Berdo, P.C.

(57) ABSTRACT

A thin film transistor substrate. The thin film transistor substrate includes a substrate, an adhesive layer on the substrate, and a semiconductor layer having a first doped region, a second doped region and a channel region on the adhesive layer. The thin film transistor substrate further includes a first dielectric layer on the semiconductor layer, a gate electrode overlapping the channel region, a second dielectric layer on the first dielectric layer and the gate electrode, a source electrode disposed on the second insulating layer, and a drain electrode spaced apart from the source electrode on the source electrode. The channel region is disposed between the first doped region and the second doped region, and has a transmittance higher than those of the first doped region and the second doped region.

5 Claims, 8 Drawing Sheets

METHOD OF MANUFACTURING THIN FILM TRANSISTOR AND THIN FILM TRANSISTOR SUBSTRATE

CROSS-REFERENCE TO RELATED APPLICATIONS

This is a divisional of co-pending U.S. application Ser. No. 12/507,725, filed Jul. 22, 2009. This U.S. non-provisional patent application claims priorities under 35 U.S.C. §119 of Korean Patent Application Nos. 10-2008-0123240, filed on Dec. 5, 2008 and 10-2009-0026256, filed on Mar. 27, 2009, the entire contents of which are hereby incorporated by reference.

BACKGROUND OF THE INVENTION

The present invention disclosed herein relates to a method of manufacturing a thin film transistor and a thin film transistor substrate that can enhance the switching speed in AC characteristic by decreasing the parasitic capacitance of the thin film transistor.

Flexible electronic devices are generally realized by using organic thin film transistors (OTFTs). When OTFTs are exposed to the atmosphere, however, their service life is shortened and reliability is also lowered. Instead of OTFTs having the limitations in service life and reliability, there has been proposed a technique in which a silicon-based thin film transistor is separated from a glass substrate or wafer substrate and is transferred onto a plastic substrate, in recent years.

Typically, the transfer of the thin film transistor is performed by manufacturing a thin film transistor on an organic substrate and then indirectly transferring the manufactured thin film transistor onto a plastic substrate. Since the related art transfer must be performed after the manufacturing of the thin film transistor is completed, it is difficult to transfer a large area and thus failure rate is increased. Meanwhile, if the transfer is performed while the thin film transistor is manufactured in order to address those limitations, self-alignment between a gate electrode and source/drain electrodes is deteriorated, so that the switching speed of the thin film transistor is lowered in AC characteristic due to a parasitic capacitance between the source electrode and the gate electrode or between the drain electrode and the gate electrode.

SUMMARY OF THE INVENTION

The present invention provides a method of manufacturing a thin film transistor that can improve self-alignment and enhance the switching speed in AC characteristic.

The present invention also provides a thin film transistor substrate manufactured by the method of manufacturing a thin film transistor.

Embodiments of the present invention provide methods of manufacturing a thin film transistor. In these methods, a semiconductor layer comprising a first doped region, a second doped region and a channel region is formed on a sacrificial layer on a first substrate. Next, the semiconductor layer is separated from the first substrate and is then coupled on a second substrate. Next, a dielectric layer is formed on the second substrate and the semiconductor layer, and a first photoresist layer is formed on the dielectric layer. Thereafter, the first photoresist layer is exposed to light from a rear surface of the second substrate by using the first doped region and the second doped region as a mask, to form a first mask pattern. Next, a gate electrode overlapping the channel region is formed on the dielectric layer by using the first mask pattern as a mask, and a source electrode and a drain electrode connected to the first doped region and the second doped region, respectively are formed to complete a thin film transistor.

In some embodiments, the forming of the semiconductor layer is performed as follows: First, a dielectric material is deposited on the first substrate to form a sacrificial layer; a semiconductor material is deposited on the sacrificial layer to form a semiconductor layer; a second mask pattern is formed on the semiconductor layer, the semiconductor layer is doped with a dopant by using the second mask pattern as a mask to form a first doped region, a second doped region and a channel region; a third mask pattern is formed on the first doped region and the second doped region; and the channel region is etched to a preset thickness by using the third mask pattern as a mask.

In other embodiments, the first mask pattern and the second mask pattern may be formed of positive photoresist, and the third mask pattern may be formed of negative photoresist.

In still other embodiments, the channel region may be etched by reactive ion etching. The preset thickness may be 100 nm or less.

In even other embodiments, the separating of the semiconductor layer from the first substrate and coupling of the separated semiconductor layer on the second substrate are performed as follows: a stamp is attached on the third mask pattern while etching the sacrificial layer; the semiconductor layer is separated from the first substrate; the separated semiconductor layer is coupled on the second substrate; and the stamp is separated from the semiconductor layer. To couple the separated semiconductor layer on the second substrate, an adhesive layer is formed on a surface of the second substrate, the separated semiconductor layer is attached on the adhesive layer, and the adhesive layer is hardened. The adhesive layer may be formed of a transparent polymer material.

In yet other embodiments, prior to the forming of the source electrode and the drain electrode, a second dielectric layer may be formed on the first dielectric layer and the gate electrode, and then a first contact hole and a second contact hole may be formed in the first dielectric layer and the second dielectric layer by etching the first dielectric layer and the second dielectric layer corresponding to the first doped region and the second doped region, respectively. The source electrode and the drain electrode may be respectively connected to the first doped region and the second doped region through the first contact hole and the second contact hole.

In other embodiments of the present invention, thin film transistor substrate includes a substrate, an adhesive layer, a semiconductor layer; a first dielectric layer, a gate electrode, a second dielectric layer, a source electrode and a drain electrode. The substrate and the adhesive layer are formed of a transparent polymer material. The semiconductor layer comprises a first doped region, a second doped region and a channel region and is disposed on the adhesive layer. The first dielectric layer on the adhesive layer and the semiconductor layer, and the gate electrode is disposed on the first dielectric layer and overlaps the channel region. The second dielectric layer is disposed on the first dielectric layer and the gate electrode. The source electrode is disposed on the second insulating layer and electrically connected to the first doped region. The drain electrode is spaced apart from the source electrode, is disposed on the source electrode and is electrically connected to the second doped region. In particular, the channel region is disposed between the first doped region and the second doped region and has a transmittance higher than those of the first doped region and the second doped region.

In some embodiments, the channel region has a thickness less than that of any one of the first doped region and the second doped region. The channel region may have a thickness less than or equal to 100 nm.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The objects, means to solve the objects, and effects of the present invention will be readily understood through embodiments related to the accompanying drawings. Each figure may be partly simplified or exaggerated for clarity of illustration. Moreover, detailed descriptions related to well-known functions or configurations will be ruled out in order not to unnecessarily obscure subject matters of the present invention.

Figure 1:
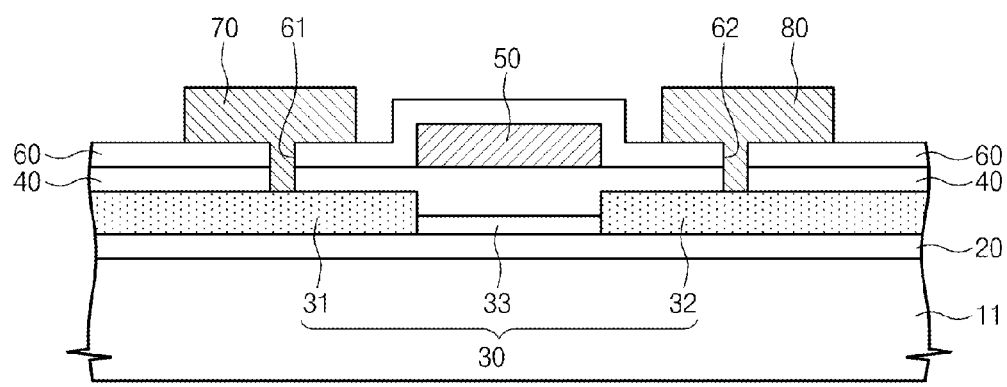
FIG. 1 is a cross-sectional view of a thin film transistor substrate according to an embodiment of the present invention.

FIG. 1 is a cross-sectional view of a thin film transistor substrate according to an embodiment of the present invention.

Referring to FIG. 1, a thin film transistor substrate according to an embodiment of the present invention includes a substrate 11, an adhesive layer 20, a semiconductor layer 30, a first dielectric layer 40, a gate electrode 50, a second dielectric layer 60, a source electrode 70, and a drain electrode 80.

The substrate 11 is transparent and is formed of a flexible and dielectric polymer material, and the adhesive layer 20 on the substrate 11 is formed of a transparent polymer material having adhesion.

The semiconductor layer 30 is disposed on the adhesive layer 20. The semiconductor layer 30 includes a first doped region 31, a second doped region 32, and a channel region 33 on the adhesive layer 20 between the first doped region 31 and the second doped region 32. The channel region 33 is formed of silicon (Si), and the first doped region 31 and the second doped region 32 are formed of silicon doped with a dopant. The channel region 33 has a thickness less than the thickness of the first doped region 31 and the second doped region 32. For example, the channel region 33 has a thickness less than 100 nm. When the channel region 33 has a thickness less than 100 nm, the channel region 33 becomes transparent.

The first dielectric layer 40 is disposed on the semiconductor layer 30 and is formed of a dielectric material, such as silicon nitride (SiNx), silicon oxide (SiOx) or the like.

The gate electrode 50 is disposed on the first dielectric layer 40 and overlaps the channel region 33 in a direction vertical to the substrate 11. To avoid misalignment, the gate electrode 50 does not substantially overlap the first doped region 31 and the second doped region 32.

The second dielectric layer 60 is disposed on the first dielectric layer 40 and the gate electrode 50, and is formed of a dielectric material, such as silicon nitride (SiNx), silicon oxide (SiOx) or the like. The first dielectric layer 40 and the second dielectric layer 60 include a first contact hole 61 and a second contact hole 62 partially exposing the first doped region 31 and the second doped region 32, respectively.

The source electrode 70 and the drain electrode 80 are disposed spaced apart from each other on the second dielectric layer 60. The source electrode 70 and the drain electrode 80 are connected with the first doped region 31 and the second doped region 32 through the first contact hole 61 and the second contact hole 62, respectively. The source electrode 70 and the drain electrode 80 receive or transmit an electrical signal through the semiconductor layer 30.

By the thin film transistor substrate according to an embodiment of the present invention, parasitic capacitances between the gate electrode 50 and the first doped region 31 and between the gate electrode 50 and the second doped region 32 are decreased. Accordingly, the switching speed of the thin film transistor on the flexible substrate can be enhanced, and the reliability of the semiconductor layer 30 formed of silicon can be enhanced.

Hereinafter, a method of manufacturing a thin film transistor according to an embodiment of the present invention will be described with reference to FIGS. 2 through 15.

FIGS. 2 through 15 are cross-sectional views illustrating a method of manufacturing a thin film transistor according to an embodiment of the present invention.

Figure 2:
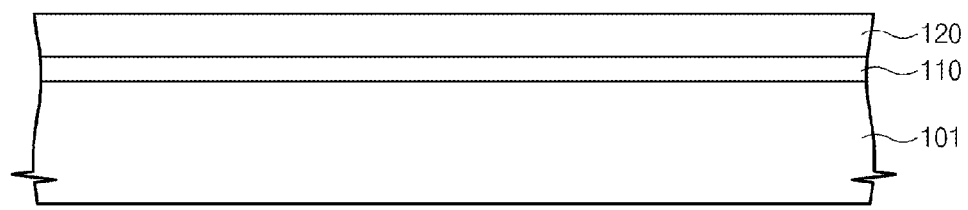
FIGS. 2 through 15 are cross-sectional views illustrating a method of manufacturing a thin film transistor according to an embodiment of the present invention.

First, referring to FIG. 2, a silicon dioxide ($SiO_2$) layer is deposited on a first substrate 101 to form a sacrificial layer 110. Thereafter, semiconductor material, for example, silicon (Si) is deposited on the sacrificial layer 110 to form a semiconductor layer 120.

Figure 3:
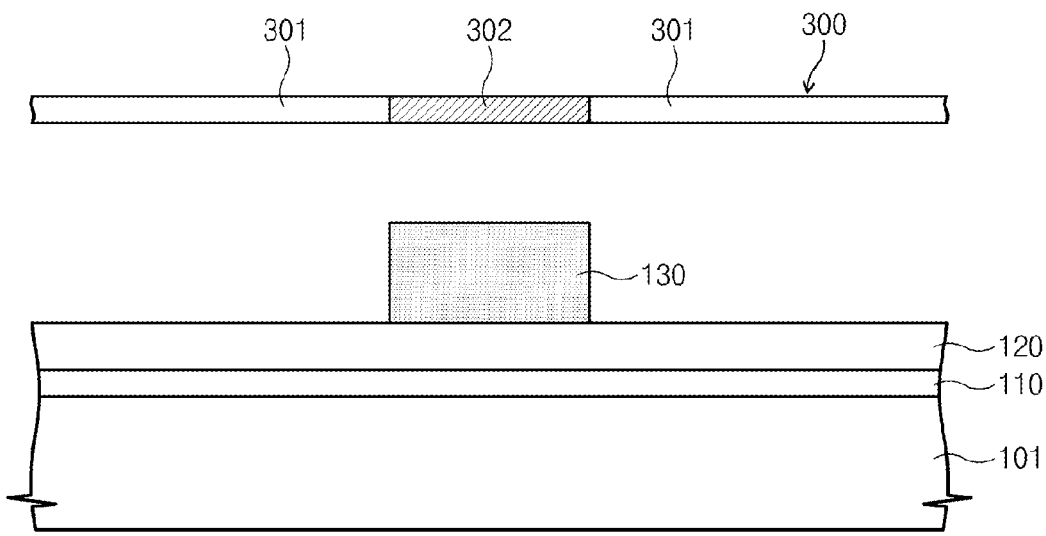

Next, referring to FIG. 3, a positive photoresist layer is coated on the semiconductor layer 120 to form a first photoresist layer, and then the first photoresist layer is exposed by an exposure process using a pattern mask 300 as a mask and is then developed to form a first mask pattern 130. The pattern mask 300 includes a light transmitting region 301 and a light shielding region 302. Since the first photoresist layer is the positive photoresist layer, portions corresponding to the light transmitting regions 301 of the pattern mask 300 are removed through the exposure and developing processes. Accordingly, the first mask pattern 130 is formed corresponding to the light shielding region 302 of the pattern mask 300.

Figure 4:
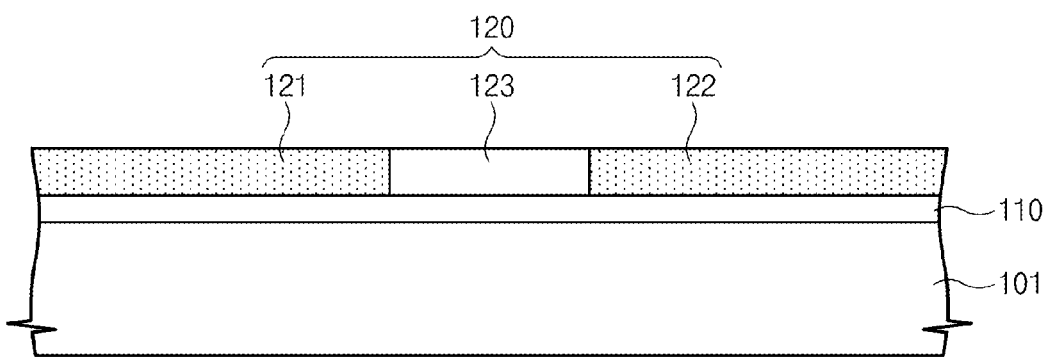

Next, referring to FIGS. 3 and 4, a dopant is implanted into the semiconductor layer 120 using the first mask pattern 130 as a mask to partially dope the semiconductor layer 120. Thereafter, the first mask pattern 130 is removed using a chemical such as acetone or the like. A region of the semiconductor layer 120 protected by the first mask pattern 130 is defined as a channel region 123, and regions of the semiconductor layer doped with the dopant are respectively defined as a first doped region 121 and a second doped region 122.

Figure 5:
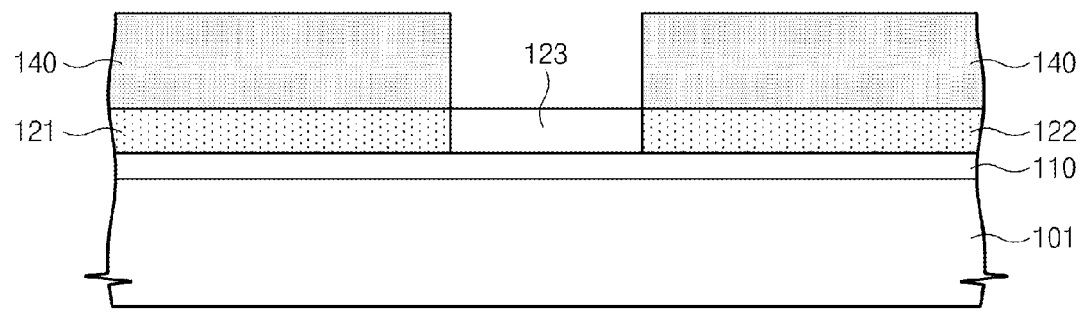

Next, referring to FIG. 5, a negative photoresist layer is coated on the semiconductor layer 120 to form a second photoresist layer, and then the second photoresist layer is exposed by an exposure process using the pattern mask 300 as a mask and is then developed to form a second mask pattern 140. Since the second photoresist layer is the negative photoresist layer, a portion corresponding to the light shielding regions 302 of the pattern mask 300 is removed through the exposure and developing processes. Accordingly, the second mask pattern 140 is formed corresponding to the light transmitting region 301 of the pattern mask 300.

Figure 6:
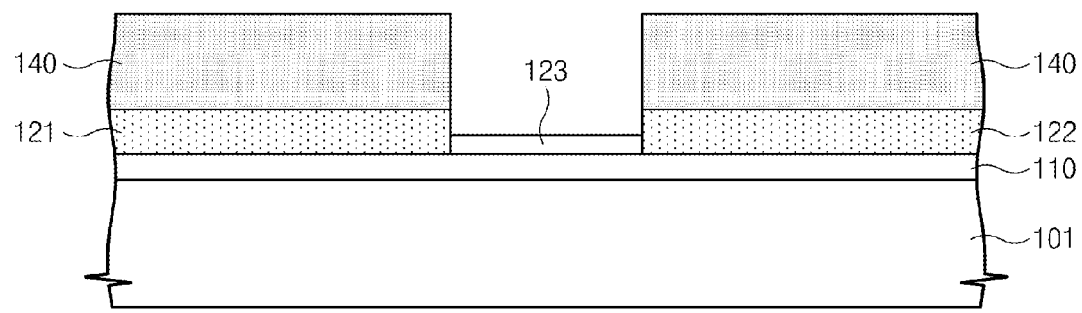
Figure 7:
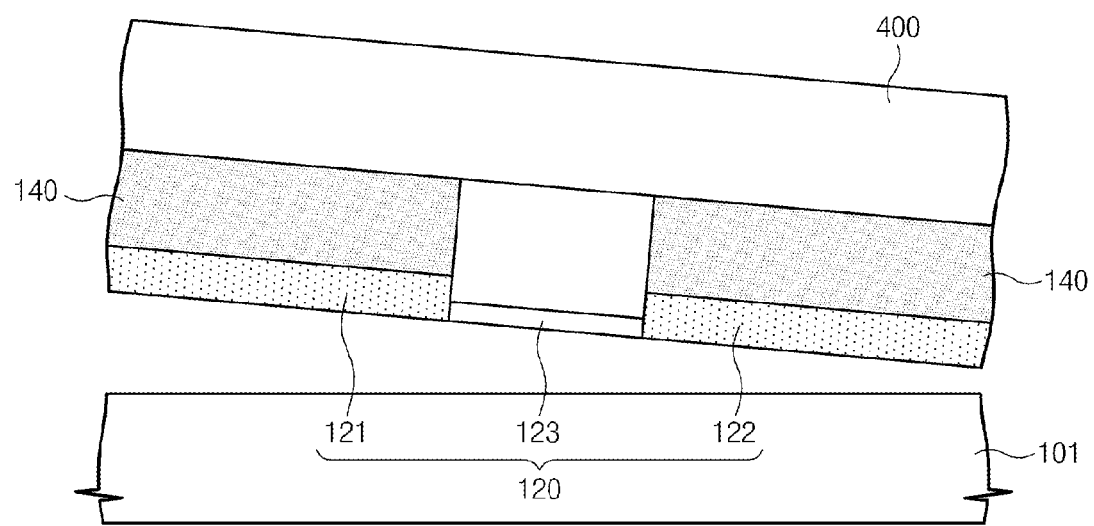
Figure 8:
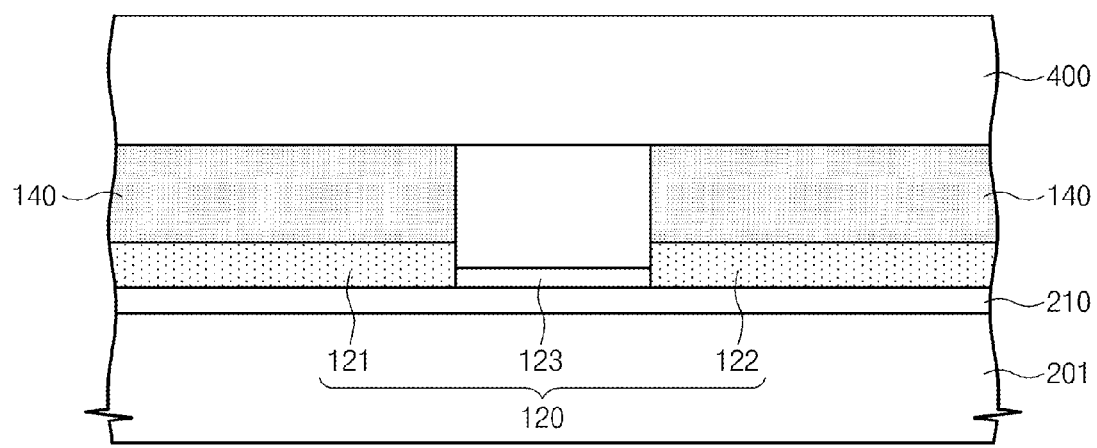
Figure 9:
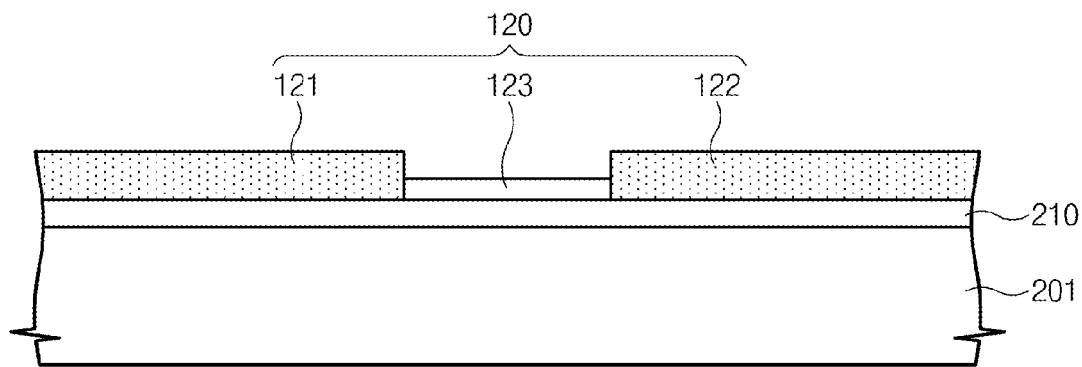

Next, referring to FIG. 6, the channel region 123 of the semiconductor layer 120 is etched to a preset thickness using the second mask pattern 140 as a mask. The channel region 123 is etched to a thickness less than a preset thickness, for example, less than 100 nm by a reactive ion etch (RIE) method. At this time, the channel region 123 with a thickness less than 100 nm becomes transparent. On the contrary, since the first doped region 121 and the second doped region 122 are thicker than the channel region 123 and are in a doped state, they become opaque.

Next, referring to FIGS. 6 through 9, the semiconductor layer 120 is separated from the first substrate 101 and is then attached on a second substrate 201.

The separating of the semiconductor layer 120 from the first substrate 101 is performed by etching the sacrificial layer 110 and attaching a polydimethylsiloxane (PDMS) stamp 400 on the second mask pattern 140. For example, at least two holes partially exposing the sacrificial layer 110 are formed in the semiconductor layer 120, and then HF solution is injected into the holes to etch the sacrificial layer 110. While the sacrificial layer 110 is etched, the PDMS stamp 400 is attached on the second mask pattern 140. When most of the sacrificial layer 110 is etched, the PDMS stamp 400 is lifted to separate the semiconductor layer 120 from the first substrate 101.

Meanwhile, the attaching of the semiconductor layer 120 on the second substrate 201 is performed by forming an adhesive layer 210 on the second substrate 201 formed of ductile and dielectric polymer material and attaching the semiconductor layer 120 attached to the PDMS stamp 400 on the second substrate 201. The adhesive layer 210 is formed of a transparent polymer material, for example, polyimide.

Next, the adhesive layer 210 is hardened, and the PDMS stamp 400 and the second mask pattern 140 are removed. Specifically, the adhesive layer 210 is first hardened at a temperature of about 100° C., the PDMS stamp 400 is separated from the second mask pattern 140, and the adhesive layer 210 is secondly hardened at a temperature of about 150° C. Thereafter, the second mask pattern 140 is removed using a chemical such as sulfuric acid, acetone or the like.

Figure 10:
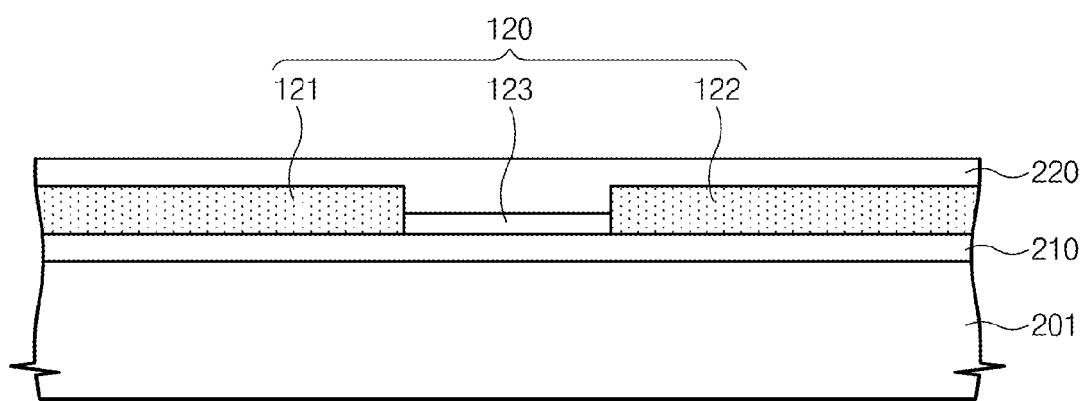

Next, referring to FIG. 10, a first dielectric layer 220 is formed on the semiconductor layer 120. The first dielectric layer 220 is formed of a dielectric material such as silicon nitride (SiNx), silicon oxide (SiOx) or the like.

Figure 11:
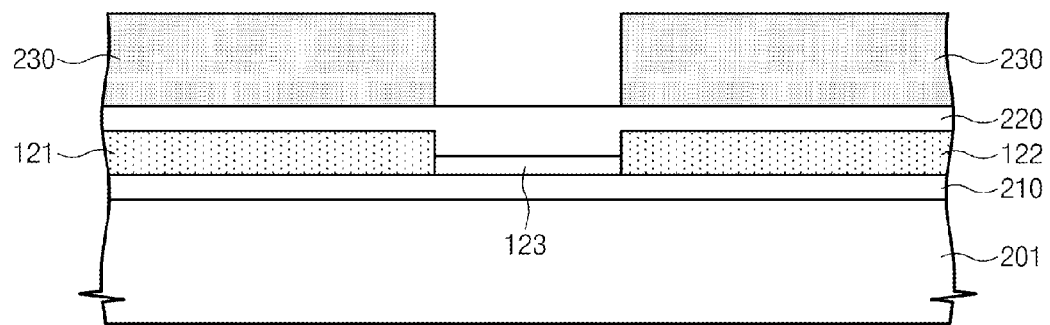

Next, referring to FIG. 11, a positive photoresist is coated on the first dielectric layer 220 to form a third photoresist layer, and the third photoresist layer is exposed using the first doped region 121 and the second doped region 122 as a mask and then developed to form a third mask pattern 230. In more detail, the third photoresist layer is partially exposed by supplying ultraviolet rays through the transparent channel region 123 from a rear surface of the second substrate 201, and the exposed portion of the third photoresist layer corresponding to the channel region 123 is removed by a developing process to form a third mask pattern 230.

Figure 12:
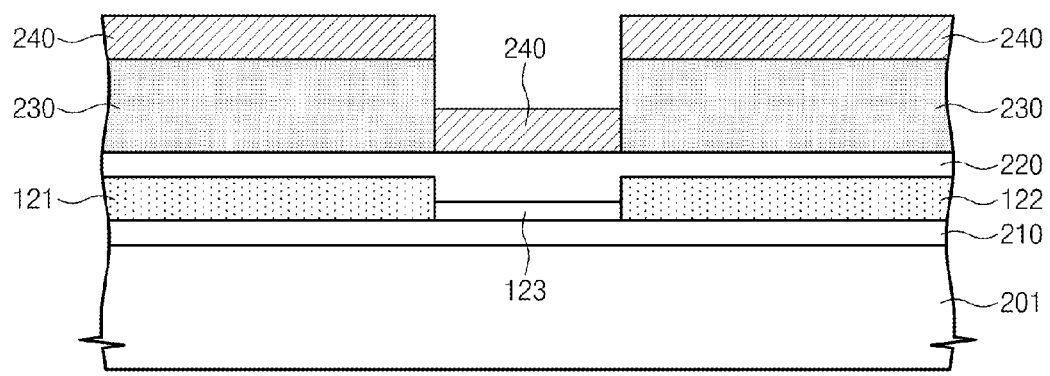
Figure 13:
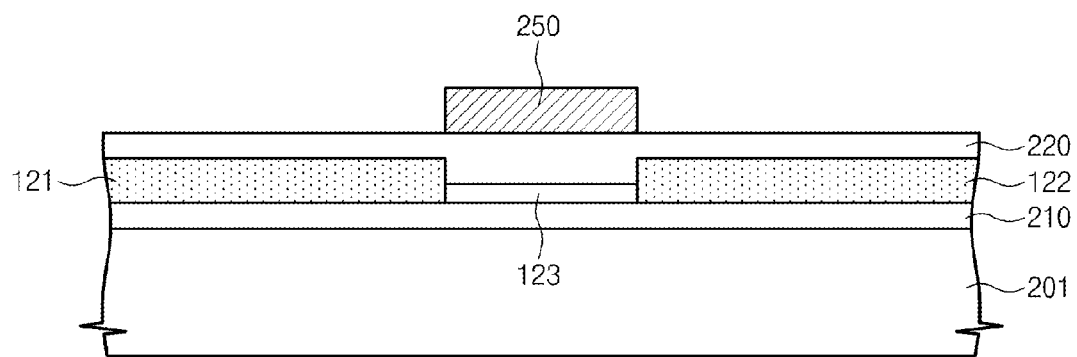

Next, referring to FIGS. 12 and 13, metal such as copper (Cu), aluminum (Al), chromium (Cr) or the like is deposited on the third mask pattern 230 and the first dielectric layer 220 to form a first conductive layer 240. Thereafter, the third mask pattern 230 is removed to form a gate electrode 250 on the first dielectric layer 220. The gate electrode 250 has substantially the same area as that of the channel region 123, and overlaps the channel region 123 in a direction vertical to the second substrate 201. The gate electrode 250 does not substantially overlap the first doped region 121 and the second doped region 122.

Figure 14:
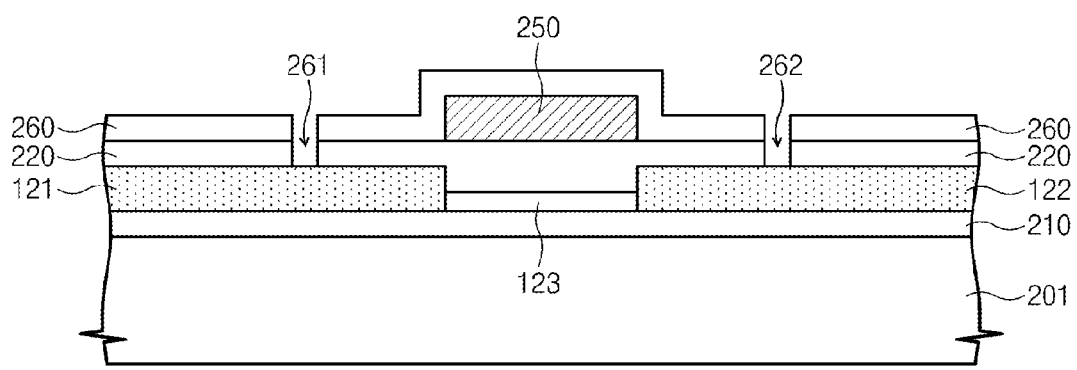

Next, referring to FIG. 14, insulation material such as silicon nitride (SiNx), silicon oxide (SiOx), or the like is deposited on the gate electrode 250 and the first dielectric layer 220 to form a second dielectric layer 260. Thereafter, a first contact hole 261 and a second contact hole 262 penetrating the first dielectric layer 220 and the second dielectric layer 260 are formed by etching the first dielectric layer 220 and the second dielectric layer 260 corresponding to the first doped region 121 and the second doped region 122.

Figure 15:
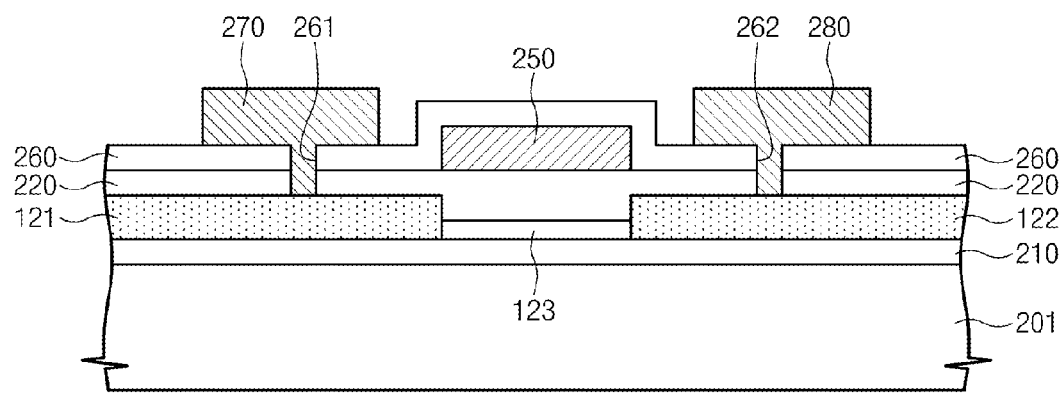

Next, referring to FIG. 15, metal such as copper (Cu), aluminum (Al), chromium (Cr) or the like is deposited on the second dielectric layer 260 to form a second conductive layer 240, and the second conductive layer 240 is patterned through an etch process to form a source electrode 270 and a drain electrode 280. The source electrode 270 and the drain electrode 280 are respectively connected to the first doped region 121 and the second doped region 122 through the first contact hole 261 and the second contact hole 262.

Through the above processes, it is possible to manufacture a thin film transistor in which self-alignment of the gate electrode 250, the first doped region 121 and the second doped region 122 is improved. By the method of manufacturing a thin film transistor according to embodiments of the present invention, it becomes possible to manufacture a thin film transistor in which self-alignment is improved, parasitic capacitance is decreased and switching speed is improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A thin film transistor substrate comprising:
a substrate;
an adhesive layer on the substrate;
a semiconductor layer comprising a first doped region, a second doped region and a channel region on the adhesive layer;
a first dielectric layer on the semiconductor layer;
a gate electrode overlapping the channel region on the first dielectric layer;
a second dielectric layer on the first dielectric layer and the gate electrode;
a source electrode disposed on the second dielectric layer and electrically connected to the first doped region; and
a drain electrode spaced apart from the source electrode and electrically connected to the second doped region,
wherein:
the channel region is disposed between the first doped region and the second doped region, and has a transmittance higher than those of the first doped region and the second doped region;
the channel region has a thickness less than that of any one of the first doped region and the second doped region; and
the first dielectric layer includes a first region disposed on the channel region and a second region disposed on the first and second doped regions, and a thickness of the first dielectric layer in the first region is greater than a thickness of the first dielectric layer in the second region.

2. The thin film transistor substrate of claim 1, wherein the substrate and the adhesive layer are formed of a transparent polymer material.

3. The thin film transistor substrate of claim 1, wherein the channel region has a thickness less than or equal to 100 nm.

4. The thin film transistor substrate of claim 1, wherein:
the first dielectric layer includes a lower surface facing the semiconductor layer and an upper surface facing the second dielectric layer;
the upper surface of the first dielectric layer in the first region is disposed at the same level as the upper surface of the first dielectric layer in the second region; and
the lower surface of the first dielectric layer in the first region is protruded with respect to the lower surface of the first dielectric layer in the second region.

5. The thin film transistor substrate of claim 1, wherein the channel region is formed of undoped silicon and the first and second doped regions are formed of silicon doped with a dopant.

* * * * *